(12) United States Patent
Gebuhr et al.

(10) Patent No.: US 11,107,958 B2
(45) Date of Patent: Aug. 31, 2021

(54) METHOD OF PRODUCING OPTOELECTRONIC SEMICONDUCTOR COMPONENTS

(71) Applicant: OSRAM Opto Semiconductors GmbH, Regensburg (DE)

(72) Inventors: Tobias Gebuhr, Regensburg (DE); Markus Burger, Laaber (DE); Markus Boß, Regensburg (DE); Markus Pindl, Tegernheim (DE)

(73) Assignee: OSRAM OLED GmbH, Regensburg (DE)

( * ) Notice: Subject to any disclaimer, the term of this patent is extended or adjusted under 35 U.S.C. 154(b) by 58 days.

(21) Appl. No.: 16/489,393

(22) PCT Filed: Mar. 19, 2018

(86) PCT No.: PCT/EP2018/056871
§ 371 (c)(1),
(2) Date: Aug. 28, 2019

(87) PCT Pub. No.: WO2018/172276
PCT Pub. Date: Sep. 27, 2018

(65) Prior Publication Data
US 2020/0119239 A1    Apr. 16, 2020

(30) Foreign Application Priority Data
Mar. 24, 2017 (DE) ..................... 10 2017 106 407.9

(51) Int. Cl.
*H01L 33/54* (2010.01)
*H01L 25/075* (2006.01)
*H01L 33/62* (2010.01)

(52) U.S. Cl.
CPC .......... *H01L 33/54* (2013.01); *H01L 25/0753* (2013.01); *H01L 33/62* (2013.01); *H01L 2933/005* (2013.01)

(58) Field of Classification Search
CPC combination set(s) only.
See application file for complete search history.

(56) References Cited

U.S. PATENT DOCUMENTS

2005/0248008 A1* 11/2005 Wilson ................ H01L 23/3135
257/678
2009/0166657 A1* 7/2009 Yamada .................. H01L 33/60
257/98

(Continued)

*Primary Examiner* — Nduka E Ojeh
(74) *Attorney, Agent, or Firm* — DLA Piper LLP (US)

(57) ABSTRACT

A method of producing optoelectronic semiconductor components includes A) providing a chip carrier with electrical conductor structures on a carrier upper side, B) applying at least one semi-conductor chip configured to produce light on at least one of the electrical conductor structures, C) applying at least one sealing structure to at least one of the electrical conductor structures so that the sealing structure completely surrounds at least one contact area when viewed from the top, and D) producing a mold body directly at the at least one semiconductor chip and directly at the at least one sealing structure by transfer molding or injection molding, wherein, in an injection mold, the at least one sealing structure seals the at least one contact area against a material of the mold body so that the at least one contact area remains free of the mold body.

15 Claims, 4 Drawing Sheets

(56) References Cited

U.S. PATENT DOCUMENTS

| | | |
|---|---|---|
| 2011/0024861 A1 | 2/2011 | Tu et al. |
| 2011/0254022 A1 | 10/2011 | Sasano |
| 2012/0241804 A1 | 9/2012 | Pyeon |
| 2013/0207126 A1* | 8/2013 | Ankireddi ............. H01L 21/568 257/81 |
| 2014/0175502 A1 | 6/2014 | Chiu et al. |
| 2015/0290887 A1 | 10/2015 | Swier et al. |

* cited by examiner

A)

B)

C)

D)

METHOD OF PRODUCING OPTOELECTRONIC SEMICONDUCTOR COMPONENTS

TECHNICAL FIELD

This disclosure relates to a method of producing optoelectronic semiconductor components.

BACKGROUND

There is a need to provide optoelectronic semiconductor components comprising a mold body that can be produced efficiently by injection molding or injection casting transfer molding.

SUMMARY

We provide a method of producing an optoelectronic semiconductor component including A) providing a chip carrier with electrical conductor structures on a carrier upper side, B) applying at least one semiconductor chip configured to produce light on at least one of the electrical conductor structures, C) applying at least one sealing structure to at least one of the electrical conductor structures so that the sealing structure completely surrounds at least one contact area when viewed from the top, and D) producing a mold body directly at the at least one semiconductor chip and directly at the at least one sealing structure by transfer molding or injection molding, wherein, in an injection mold, the at least one sealing structure seals the at least one contact area against a material of the mold body so that the at least one contact area remains free of the mold body, the electrical conductor structures are electrical conductor tracks and also electrical contact surfaces, and the contact area comprises at least two of the electrical contact surfaces that are configured for external electrical contacting of the finished semiconductor component.

We also provide a method of producing optoelectronic semiconductor components including A) providing a chip carrier with electrical conductor structures on a carrier upper side, B) applying at least one semiconductor chip configured to produce light on at least one of the electrical conductor structures, C) applying at least one sealing structure to at least one of the electrical conductor structures so that the sealing structure completely surrounds at least one contact area when viewed from the top, and D) producing a mold body directly at the at least one semiconductor chip and directly at the at least one sealing structure by transfer molding or injection molding, wherein, in an injection mold, the at least one sealing structure seals the at least one contact area against a material of the mold body so that the at least one contact area remains free of the mold body.

Figure 1:
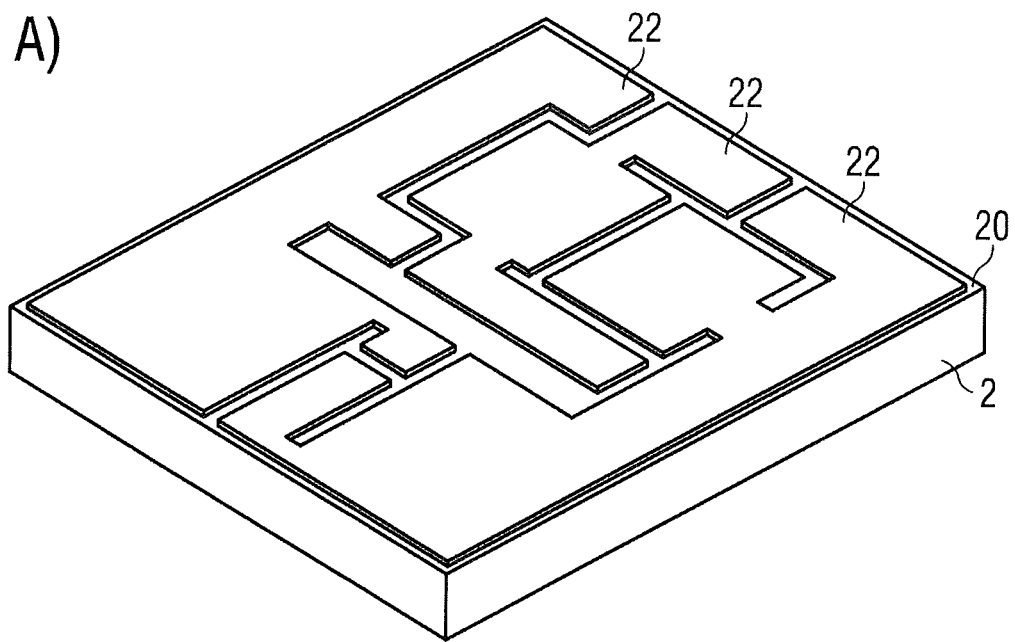
FIGS. 1A-1D show schematic perspective representations of method steps of a method of producing optoelectronic semiconductor components.
Figure 1:
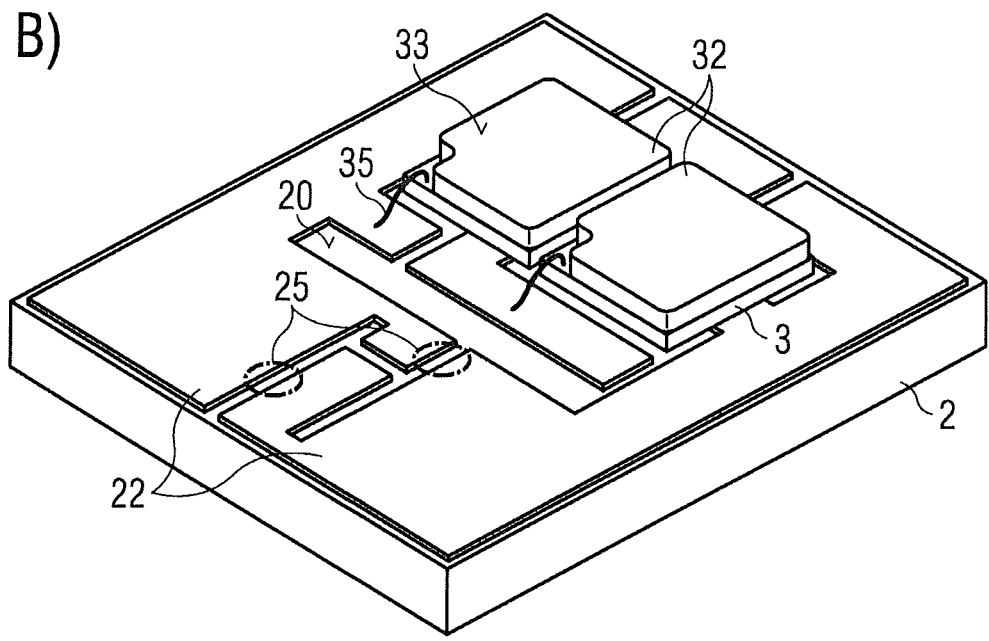
Figure 1:
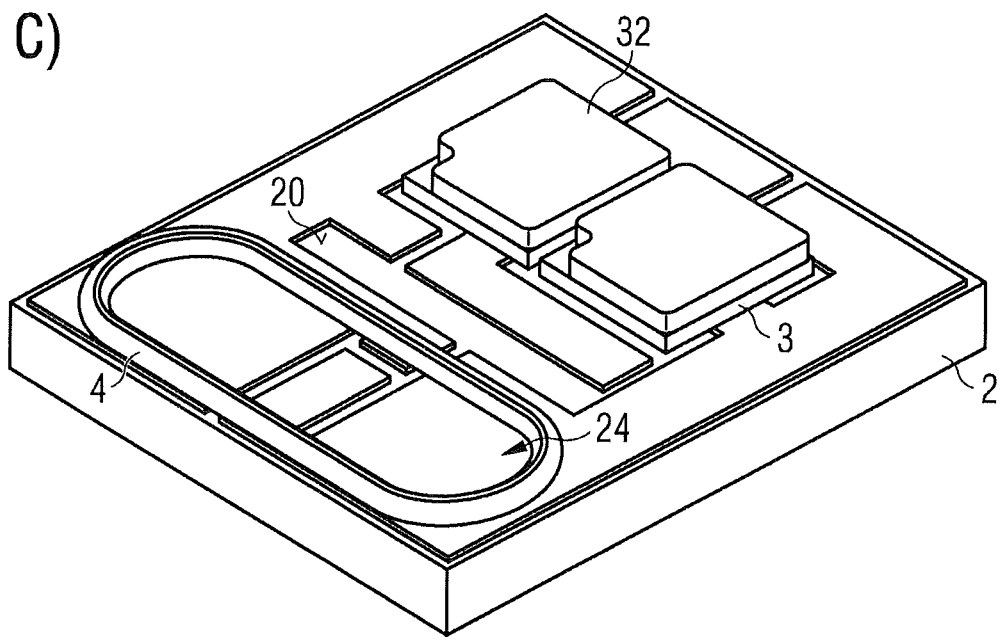
Figure 1:
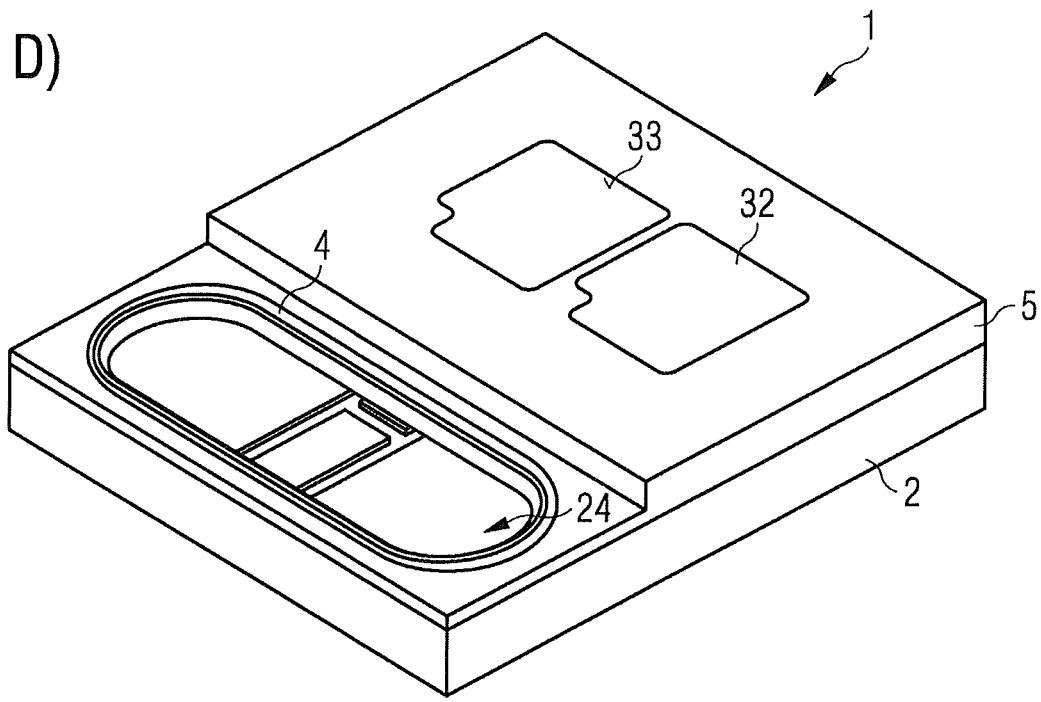

LIST OF REFERENCE SIGNS 1 optoelectronic semiconductor component
2 chip carrier
20 carrier upper side
22 electrical conductor structure
24 contact area
25 gap
3 semiconductor chip
30 chip top side
32 luminous substance body
33 body upper side
35 bonding wire
4 sealing structure
5 mold body
61 injection mold, upper part
62 injection mold, lower part
66 sealing film

DETAILED DESCRIPTION

Our method produces optoelectronic semiconductor components. The semiconductor components are preferably light-emitting diodes. The semiconductor components are thus particularly suitable for generating radiation, especially visible light.

A chip carrier may be provided. The chip carrier is preferably the component that carries the finished semiconductor components and mechanically stabilizes them. For example, the chip carrier is a ceramic substrate, a glass substrate or a semiconductor substrate. It is also possible to use printed circuit boards such as metal core boards or printed circuit boards, for the chip carrier.

The chip carrier may comprise electrical conductor structures on an upper side of the carrier. The electrical conductor structures are electrical conductor tracks and/or electrical contact surfaces. A circuitry within the semiconductor component is possible via the electrical conductor tracks. The electrical contact surfaces are used in particular for internal and/or external contacting of the semiconductor component. The conductor structures are preferably formed by one or more metallizations.

The method may comprise the step of applying one or more semiconductor chips to at least one of the electrical conductor structures. For example, the at least one semiconductor chip is electrically conductively bonded or, preferably, soldered. It is possible for a unique assignment to exist between the conductor structures and the semiconductor chips. For example, at least two or at least four and/or at most 16 or at most eight of the semiconductor chips are applied per chip carrier for a respective finished semiconductor component.

The semiconductor chips may be flip-chips in which electrical contacts lie on a single side, or chips with electrical contacts on mutually opposite main sides. In flip chips, the electrical contacts face the carrier upper side or can also face away from the carrier upper side. The at least one semiconductor chip generates radiation, preferably light. For example, the at least one semiconductor chip emits blue light or white light during operation. In the semiconductor components only structurally identical semiconductor chips or different semiconductor chips can be arranged to produce light of different colors, for example.

At least one sealing structure may be attached. The one or more sealing structure(s) may be partially or completely applied to the electrical conductor structures. In particular, the sealing structures are located completely on the carrier upper side. The sealing structures are preferably permanent components so that the sealing structures are present in the finished semiconductor components.

The sealing structures may completely surround at least one contact area, viewed in plan view on the carrier upper side, all the way around. The sealing structure may form a continuous frame around the contact area. The contact area preferably contains one or more electrical contact surfaces for external electrical contacting of the finished semiconductor components.

The method may comprise the step of producing a mold body. The mold body is preferably produced by injection molding or transfer molding. The mold body may be formed directly on the at least one semiconductor chip and directly on the sealing structure. This means that the mold body touches both the semiconductor chip and the sealing structure.

Production of the mold body may take place in an injection mold. The injection mold preferably comprises several parts, in particular two parts mounted to be movable relative to each other. By the injection mold, a shape of the mold body is formed.

In the injection mold, the sealing structure may seal the at least one contact area with respect to a material of the mold body during the production of the mold body. In other words, the contact area remains free of the mold body due to the sealing structure. If the sealing structure is not present in the injection mold, the contact area would be covered with the mold body.

The method produces optoelectronic semiconductor components and may comprise the following steps, in particular in the order given below:

A) providing a chip carrier with electrical conductor structures on a carrier upper side,
B) applying at least one semiconductor chip configured to generate light on at least one of the electrical conductor structures,
C) applying at least one sealing structure to at least one of the electrical conductor structures so that the sealing structure completely surrounds at least one contact area when viewed in plan view, and
D) producing a mold body directly at the at least one semiconductor chip and directly at the at least one sealing structure by injection molding or transfer molding, in an injection mold the at least one sealing structure seals the at least one contact area against a material of the mold body so that the at least one contact area remains free of the mold body.

The process steps B) and C) can also be interchanged in deviation from the above listing.

In the production of castings in large-area products by injection molding or transfer molding, a sealing film is usually used for sealing in an injection mold. Such a method is also referred to as film-assisted molding or FAM for short. A sealing by sealing films is, however, difficult if different levels of height occur, that is, if mold bodies with different heights shall be produced in a component. This is especially due to the occurring height tolerances of the chip carrier and the semiconductor chips applied thereto and optionally of fluorescent substances.

To achieve adequate sealing in mold bodies with different thicknesses, in conventional methods very thick sealing films must be used to be able to compensate for the height tolerances. In this example, a strong film deformation must be accepted in the injection mold, which leads to non-uniformly shaped component surfaces.

The sealing structure is used instead of a very thick sealing film to produce a sealing frame on at least one plane. The contact area is sealed with respect to the material of the mold body by the sealing structure. Such a sealing frame, formed by the sealing structure, is also referred to as "glob top." In particular, the sealing structure is compressed by a clamping force in the injection mold, or pressed into the sealing film so that a seal of the contact area with respect to the remaining cavity to be filled with the material for the mold body is realized.

Because of the elasticity of the sealing structure, in particular of the glob top, it is possible to compensate for considerably higher tolerances than just via the compression of a thick sealing film. It is thus possible to produce semiconductor components with uniformly shaped surfaces. Due to the efficient, particularly dense sealing by the sealing structure, additional post-working steps such as cleaning surfaces can be avoided. In addition, it is possible to reduce the complexity of the injection mold, since, for example, no or fewer movable tool inserts are required.

Briefly summarized, the method is a film-assisted molding with a sealing structure in the form of a glob top.

In step D) a sealing film may be arranged between the injection mold and the semiconductor chip and between the injection mold and the sealing structure. The sealing film seals with respect to the material of the mold body.

In step D), in particular at the temperature used in step D), the sealing film may have a modulus of elasticity of at least 20 MPa or 30 MPa or 40 MPa. Alternatively or additionally, the modulus of elasticity of the sealing film may be at most 90 MPa or 80 MPa or 70 MPa. In other words, a comparatively soft sealing film is used.

Directly preceding step D), the sealing film may have a thickness of at least 10 μm or 20 μm or 30 μm. Alternatively or additionally, the thickness of the sealing film may be at most 100 μm or 70 μm or 50 μm. That is, a comparatively thin sealing film is used.

In step D), the sealing structure may comprise a modulus of elasticity greater than that of the sealing film. In particular, in step D) the modulus of elasticity of the sealing structure is at least a factor of 1.5 or 2 or 3 greater than that of the sealing film. In this way, particularly dimensionally stable sealing structures can be achieved so that the material for the mold body can be processed with comparatively high pressures and/or with a comparatively high viscosity in step D).

The sealing structure may be made in part or entirely of an epoxide.

The sealing film may be made of polyethylene terephthalate, PET for short. Alternatively, the sealing film may be made of an ethylene-tetrafluoroethylene copolymer, ETFE for short. It is also possible for the sealing film to be composed of several layers, also of different materials.

In step D), in places or entirely, the sealing structure may comprise a modulus of elasticity greater than that of the sealing film. The modulus of elasticity of the sealing structure is, for example, at least a factor of 1.25 or 1.5 or 2 lower than the modulus of elasticity of the sealing film. In comparatively soft sealing structures preferably having a relatively small thickness, a particularly dense sealing with respect to the sealing film can be achieved.

The sealing structure may be in places or entirely made of a silicone or a silicone-epoxy hybrid material.

In step D), the sealing structure may be compressed. In particular, in step D), there is in this example no deformation of the sealing film or no significant deformation of the sealing film. For example, the deformation of the sealing film is at most 10% of the average thickness of the sealing film before it is compressed. The sealing structure is deformed, for example, by at least 15% or 20% and/or by at most 30% or 25% of its mean thickness.

In step D), the sealing structure may be pressed into the sealing film. During this pressing, a thickness of the sealing structure preferably changes by at most 20% or 15% or 10% of an average thickness of the sealing structure and/or a thickness of the sealing film changes by at least 10% or 20% or 30%. In other words, less the sealing structure, but mainly the sealing film is deformed.

The sealing structure may project beyond the mold body in the direction away from the carrier upper side after step D). This is especially true after the mold body has been completely finished and after the semiconductor components have been removed from the injection mold. This projection results in particular from a deformation of the sealing structure and/or of the sealing film in step D).

As an alternative, it is also possible for the sealing structure and the mold body to terminate flush or approximately flush with each other. 'Approximately flush' means, for example, a tolerance of at most 10 μm or 5 μm or 2 μm.

A luminous substance body may be applied to the at least one semiconductor chip. The luminous substance body is, for example, a mold body or a platelet comprising at least one luminescent substance. Such platelets can be based on a comparatively soft material such as a silicone, or of hard materials such as a glass or a ceramic. Such luminous substance bodies can be located directly on a top side of the semiconductor chip facing away from the carrier upper side. It is likewise possible for such luminous substance bodies to connect via a connecting means such as an adhesive, for example, a glass or a silicone on the top side of the chip. It is also possible that each semiconductor chip is assigned its own luminous substance body. Alternatively, several or all of the semiconductor chips can be covered by a common luminous substance body. The luminous substance body contains one or more luminescent substances, preferably inorganic luminescent substances such as YAG:Ce or quantum dots.

After the step D), the top side of the at least one semiconductor chip facing away from the chip carrier or a body upper side of the at least one luminous substance body facing away from the chip carrier, in the direction away from the carrier upper side, may terminate flush with the mold body. This is particularly true with a tolerance of at most 10 μm or 5 μm or 2 μm.

The mold body may have a smaller height on the sealing structure than on the semiconductor chip. In particular, one or more steps may be formed in the mold body. It is thus possible for the sealing structure and the semiconductor chip, optionally together with the luminous substance body, to have different heights and nevertheless terminate flush or approximately flush with the mold body.

The sealing structure may be arranged in places directly on the carrier upper side, in particular on a base material of the chip carrier, and may be applied in places directly to the conductor structures. A gap between adjacent conductor structures is closed by the sealing structure in the direction parallel to the carrier upper side so that a sufficient seal with respect to the material of the mold body is achieved. A height of the conductor structures above the base material of the chip carrier is, for example, at least 20 μm or 40 μm and/or at most 100 μm or 80 μm or 60 μm.

The sealing structure may have an average thickness or height above the carrier upper side of at least 50 μm or 100 μm or 150 μm. Alternatively or additionally, the average thickness or height of the sealing structure is at most 400 μm or 300 μm or 230 μm.

The mold body and the sealing structure may have materials different from each other, in particular materials of different material classes such as a silicone for the mold body and an epoxide for the sealing structure. It is also possible for the sealing structure and the mold body to be based on the same material, for example, each may be based on a silicone.

The mold body may be white. In particular, the mold body may have a high reflectivity for visible light. Alternatively, the mold body can be transparent. The sealing structure can have a different color or the same color than the mold body. For example, it is possible for the sealing structure to have a specific color different from that of the mold body, for example, black or grey to form positioning marks or other markings.

A thickness of the conductor structures above the carrier upper side may be at least 10% or 20% of an average thickness of the sealing structure. Alternatively or in addition, the conductor structures have a thickness of at most 40% or 30% or 25% of the average thickness of the sealing structure. In other words, the conductor structures are relatively thick compared to the sealing structure.

In step C), the sealing structure may be applied as paste or as a liquid. Application of the sealing structure can take place via printing, coating with a doctor blade or drawing with a paste. After the sealing structure has been applied, the sealing structure is preferably hardened so that the sealing structure has a greater hardness in step D) than in the originally applied state.

The mold body may be limited to a region above the carrier upper side. Side surfaces and a carrier underside of the chip carrier opposite the carrier upper side are preferably free of the mold body. It is possible for the entire carrier upper side to be covered by the mold body together with the contact area, by the sealing structure and the at least one semiconductor chip. In particular, in a plan view of the finished semiconductor components, only the luminous substance bodies, the mold body, the sealing structure and the contact area can be seen.

The sealing structure may have a monotonously or strictly monotonously decreasing width in the direction away from the carrier upper side. When viewed in cross-section, the sealing structure appears, for example, triangular or parabolic or semi-circular. Alternatively or in addition, it is possible for the mold body to cover the sealing structure in places as seen in plan view, in particular starting from a point of greatest thickness of the sealing structure and in the direction away from the contact area.

The method may comprise the step of singulating to the semiconductor components. In particular, the chip carrier and the mold body may be severed by sawing, for example, when they are singularized. The finished semiconductor components have, for example, separation traces on side surfaces of the chip carrier and on side faces of the mold body. The contact area is preferably not affected by such a singulation, preferably just as little is the sealing structure.

A semiconductor component produced by such a method is also provided. Therefore, features of the method also disclosed for the finished semiconductor component and vice versa.

In the following, a method described here and a semiconductor component described here are explained in more detail with reference to the drawings on the basis of examples. The same reference signs indicate the same elements in the individual figures. However, no true-to-scale references are shown. Rather, individual elements may be represented exaggeratedly large for a better understanding.

FIG. 1 illustrates a method of producing optoelectronic semiconductor components 1. According to FIG. 1A, a chip carrier 2 is provided. On a carrier upper side 20 of the chip carrier 2, there are a plurality of electrical conductor structures 22. The conductor structures 22 form conductor tracks and electrical contact surfaces. The conductor structures 22 are preferably formed by one or more metallizations. For a sufficient current-carrying capacity, the conductor structures 22 have, for example, a thickness of 40 µm to 60 µm. In particular, the conductor structures 22 comprise copper, gold, silver, tin, platinum, chromium, aluminum and/or palladium.

FIG. 1B shows that a plurality of semiconductor chips 3, in particular light-emitting diode chips, are applied to the conductor structures 22. The light-emitting diode chips 3 electrically connect in series, for example. Furthermore, the semiconductor chips 3 are preferably each provided with a luminous substance body 32. In this example, there is preferably a one-to-one assignment between semiconductor chips 3 and luminous substance bodies 32.

As an option, the luminous substance bodies 32 have a recess in a corner region. A bonding wire 35 is attached to each of these recesses and electrically connects the semiconductor chips 3 to the conductor structures 22. Electrical contacts of the semiconductor chips 3 are located, for example, on mutually opposite main sides of the semiconductor chips 3.

It can also be seen in FIG. 1B that a plurality of gaps 25 are located between the conductor structures 22, in which the carrier upper side 20 is exposed in places. There is, for example, a height difference of approximately 50 µm in these gaps 25.

According to FIG. 1C, a sealing structure 4 is applied, for example, in the form of a paste that is subsequently hardened and/or dried, also referred to as glob top. The sealing structure 4 extends all the way around a contact area 24 in a closed path with a constant or approximately constant height above the carrier upper side 20. The contact area 24 contains, for example, two electrical contact surfaces for external electrical contacting of the finished semiconductor component 1. The gaps 25 shown in FIG. 1B are preferably also sealed by the sealing structure 4. For example, the sealing structure is black and made of an epoxide.

According to FIG. 1D, a mold body 5 is produced. The mold body 5 terminates flush or approximately flush with a body upper side 33 of the luminous material body 32 facing away from the chip carrier 2 and with the sealing structure 4. By the sealing structure 4 it is prevented that the contact area 24 is contaminated with the material of the mold body 5 during the production of the mold body 5.

The mold body 5 optionally has a step between the contact area 24 and the luminous material bodies 32. This step bridges, for example, a height difference of at least 50 µm or 100 µm and/or of at most 300 µm or 200 µm. This is in particular due to the comparatively low thickness of the sealing structure of approximately 100 µm+/50 µm. On the other hand, the semiconductor chips 3 together with the luminous material bodies 32 have a thickness of approximately 200 µm to 300 µm, for example.

Figure 2:
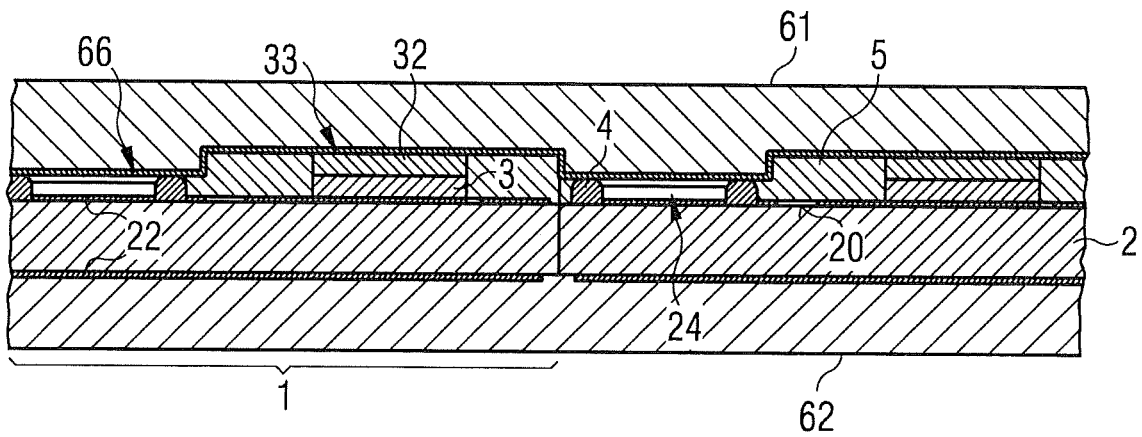
FIGS. 2 and 7A-7C are schematic sectional representations of method steps of a method.

FIG. 2 illustrates the step of producing the mold body 5. The mold body 5 is produced by injection molding or transfer molding in an injection mold with an upper part 61 and a lower part 62. A sealing film 66 is used to seal between the upper part 61 and the chip carriers 2. The sealing film 66 is made, for example, of ETFE or PET with a thickness of approximately 50 µm. The sealing film 66 is placed directly on the body upper sides 33 and directly on the sealing structure 4. By pressing together of the parts 61, 62, a sealing of the injection mold is achieved. By doing so, the sealing structure 4 is deformed to compensate for thickness tolerances. In particular, the sealing structure 4 has a greater elasticity, that is a smaller modulus of elasticity, than the semiconductor chips 3 together with the luminous material bodies 32.

As an option, the chip carrier 2 has the conductor structures 22 both on the carrier upper side 20 and on an opposite carrier lower side. Electrical through-connections can be formed in the carrier 2 that extend from the carrier upper side 20 to the underside of the carrier 2. However, the carrier 2 is preferably free from electrical through-connections so that the conductor structures 22 on the carrier lower side serve only for mounting and heat dissipation.

Figure 3:
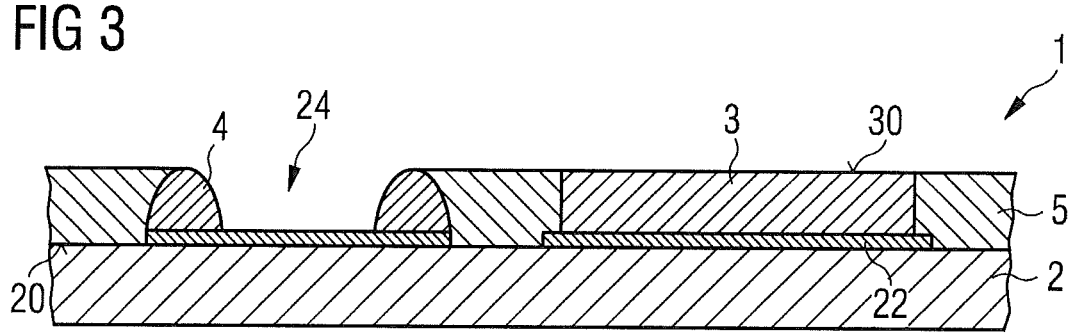
FIGS. 3 to 6 are schematic sectional views of examples of optoelectronic semiconductor components.

A further example is illustrated in FIG. 3. In this example, the semiconductor component 1 has no luminous material body. The mold body 5 is flush with the chip top side 30 and with the sealing structure 4, with a tolerance of a few micrometers. In particular, the tolerance is at most 10% or 5% of an average thickness of the sealing structure 4 and/or of the semiconductor chips 3, as can also apply in all other examples.

Seen in cross-section it is possible that outside the gaps 25 as shown in FIG. 1B, the sealing structure 4 lies completely on the conductor structures 22.

Figure 4:
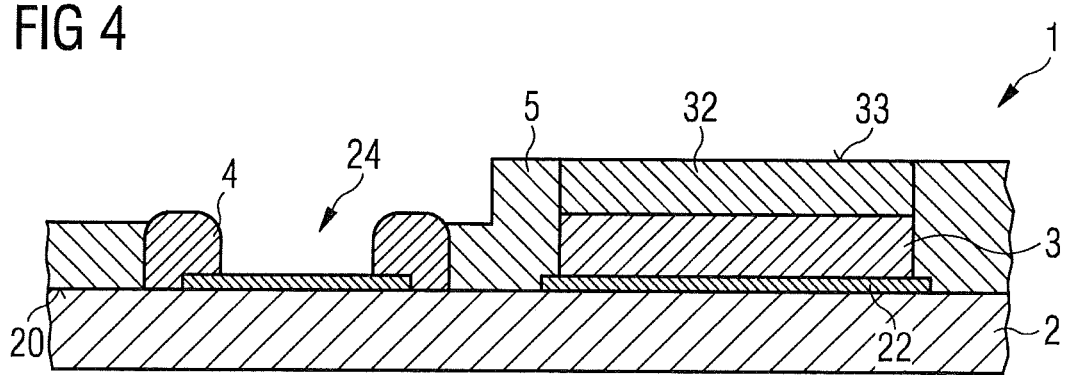

In the example of FIG. 4, seen in the cross-section, also outside the gaps the sealing structure 4 is located only partially on the conductor structures 22. The body upper sides 33 are flush with the mold body 5. The sealing structure 4 is made, for example, of a soft material such as a silicone and projects beyond the finished mold body 5.

Figure 5:
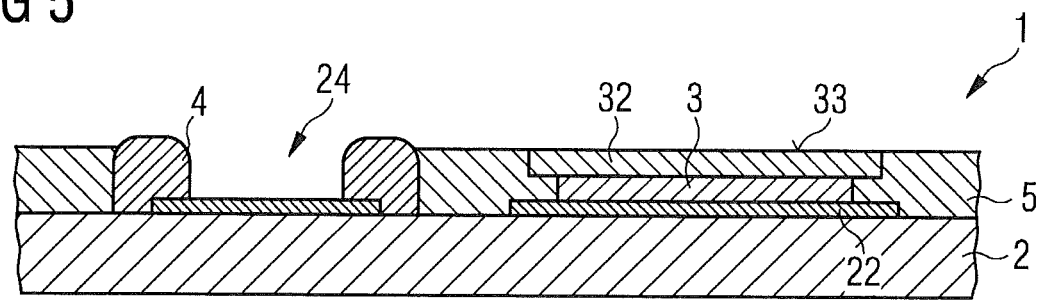

According to FIG. 5, the body upper side 33 is flush with the mold body 5. It is possible, as is also in all other examples, that the luminous material body 32 projects laterally beyond the associated semiconductor chip 3.

The sealing structure 4 has approximately the same height as the semiconductor chip 3 together with the luminous material body 32. The sealing structure 4 projects slightly beyond the mold body 5.

Figure 6:
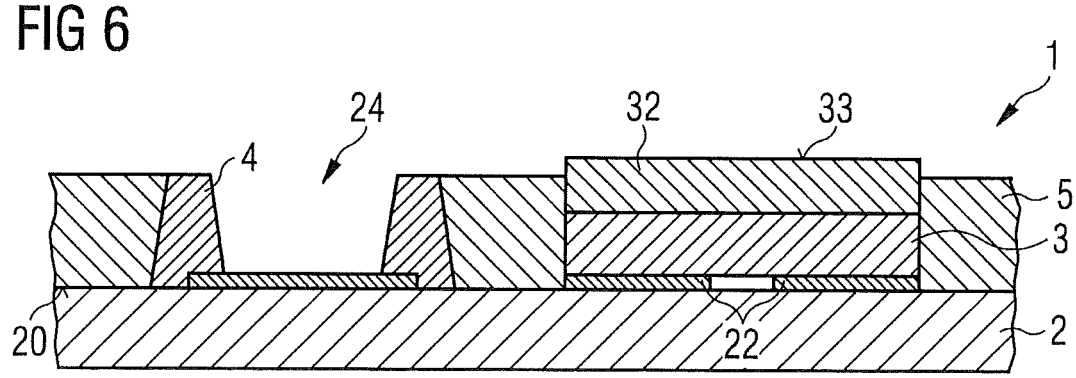

It can be seen in FIG. 6 that the luminous material body 32 projects slightly beyond the mold body 5. As well as in all other examples it is possible that the semiconductor chip 3 is designed as a flip-chip with electrical contact surfaces facing the carrier 2.

During production of the mold body 5, the sealing structure 4 was pressed together so that a side of the sealing structure 4 facing away from the carrier upper side 20 is pressed flat and runs approximately parallel to the carrier upper side 20.

Figure 7:
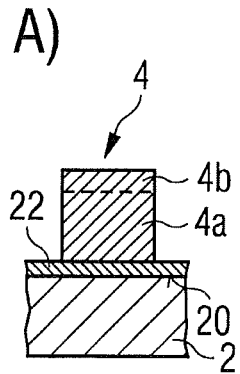
Figure 7:
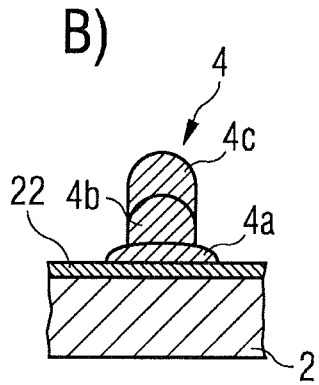
Figure 7:
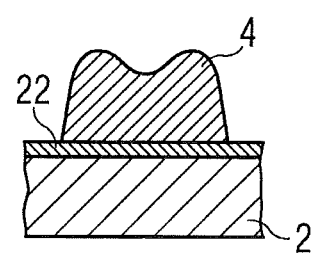

In FIG. 7, further optional examples of the sealing structure 4 are illustrated. The sealing structures 4 shown in FIG. 7 can be used accordingly in all other examples.

According to FIGS. 7A and 7B, the sealing structure 4 is composed of several parts. For example, as shown in FIG. 7A, a comparatively hard region 4a is present, which is made, for example, of an epoxide in the direction away from the carrier upper side 20 the hard region 4a is covered by a thin, softer region 4b.

As well as in all other examples, it is possible, when viewed in cross-section, that the sealing structure 4 is neither round nor semicircular nor parabolic, but rectangular as shown in FIG. 7A.

According to FIG. 7B, the sealing structure 4 is composed of three partial regions 4a, 4b, 4c. For example, the partial regions 4a, 4c are made of soft material and the region 4b is made of a relatively hard material. As a result, the gaps 25 as shown in FIG. 1B can be efficiently closed and a good seal can be achieved with respect to the sealing film. At the same time, the sealing structure 4 only slightly deforms in the injection mold 61, 62.

In the design of FIG. 7C, the sealing structure 4 has, seen in cross-section, not only one but two maxima. A secure seal with respect to the sealing film can be achieved in this way.

The components shown in the figures follow, unless otherwise indicated, preferably in the order given each directly on top of one another. Layers which are not touching in the figures are arranged at a distance from each other. As far as lines are drawn parallel to one another, the corresponding surfaces are likewise aligned parallel to one another. Also unless otherwise indicated, the relative thickness ratios, length ratios and positions of the components in relation to one another are correctly reproduced in the figures.

The methods described here are not limited by the description given by the examples. Rather, this disclosure includes each new feature as well as each combination of features, which in particular includes each combination of features in the appended claims, even if the feature or combination itself is not explicitly stated in the claims or examples.

This application claims priority of DE 10 2017 106 407.9, the subject matter of which is incorporated herein by reference.

The invention claimed is:

1. A method of producing an optoelectronic semiconductor component comprising:
    A) providing a chip carrier with electrical conductor structures on a carrier upper side,
    B) applying at least one semiconductor chip configured to produce light on at least one of the electrical conductor structures,
    C) applying at least one sealing structure to at least one of the electrical conductor structures so that the sealing structure completely surrounds at least one contact area when viewed from the top, and
    D) producing a mold body directly at the at least one semiconductor chip and directly at the at least one sealing structure by transfer molding or injection molding,
    wherein, in an injection mold, the at least one sealing structure seals the at least one contact area against a material of the mold body so that the at least one contact area remains free of the mold body,
    the electrical conductor structures are electrical conductor tracks and also electrical contact surfaces, and
    the contact area comprises at least two of the electrical contact surfaces that are configured for external electrical contacting of the finished semiconductor component.

2. The method according to claim 1, wherein, in D), a sealing film is located between the injection mold and the semiconductor chip as well as between the injection mold and the sealing structure, and a modulus of elasticity of the sealing structure at a temperature used in D) is 20 MPa to 90 MPa and a thickness of the sealing structure is 20 µm to 100 µm.

3. The method according to claim 2, wherein, in D), the sealing structure at least in places has a modulus of elasticity greater by at least a factor of 2 than that of the sealing film.

4. The method according to claim 3, wherein the sealing structure is at least partly made of an epoxide and the sealing film is made of polyethylene terephthalate or an ethylene-tetrafluoroethylene copolymer.

5. The method according to claim 2, wherein, in D), the sealing structure has at least in places a modulus of elasticity smaller by at least a factor of 1.5 than that of the sealing film.

6. The method according to claim 5, wherein the sealing structure is made of a silicone at least in places.

7. The method according to claim 2, wherein, in D), the sealing structure is pressed into the sealing film.

8. The method according to claim 7, wherein the sealing structure projects beyond the mold body in the direction away from the carrier upper side after D).

9. The method according to claim 1, further comprising applying a luminous substance body to a chip top side of the chip facing away from the chip carrier,
    wherein, after D), a body upper side of the luminous substance body facing away from the chip carrier is flush with the mold body in a direction away from the carrier upper side, with a tolerance of at most 5 µm.

10. The method according to claim 1, wherein the mold body has a smaller height above the carrier upper side at the sealing structure than the semiconductor chip.

11. The method according to claim 1, wherein the sealing structure is applied in places directly on the carrier upper side and in places directly on the electrical conductor structures so that in the direction parallel to the carrier upper side, gaps between adjacent electrical conductor structures are closed by the sealing structure.

12. The method according to claim 11, wherein a thickness of the electrical conductor structures is 10% to 30% of an average thickness of the sealing structure.

13. The method according to claim 1, wherein, in D), the sealing structure is compressed.

14. The method according to claim 1, wherein, in C), the sealing structure is applied as a paste and is afterwards hardened.

15. A method of producing optoelectronic semiconductor components comprising:
    A) providing a chip carrier with electrical conductor structures on a carrier upper side,
    B) applying at least one semiconductor chip configured to produce light on at least one of the electrical conductor structures,
    C) applying at least one sealing structure to at least one of the electrical conductor structures so that the sealing structure completely surrounds at least one contact area when viewed from the top, and
    D) producing a mold body directly at the at least one semiconductor chip and directly at the at least one sealing structure by transfer molding or injection molding,
    wherein, in an injection mold, the at least one sealing structure seals the at least one contact area against a material of the mold body so that the at least one contact area remains free of the mold body, and the contact area is configured for external electrical contacting of the finished semiconductor component.

\* \* \* \* \*